(12) United States Patent
Takeda et al.

(10) Patent No.: US 11,404,453 B2
(45) Date of Patent: Aug. 2, 2022

(54) PHOTODETECTOR

(71) Applicant: Nippon Telegraph and Telephone Corporation, Tokyo (JP)

(72) Inventors: Kotaro Takeda, Musashino (JP); Kentaro Honda, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 120 days.

(21) Appl. No.: 17/056,152

(22) PCT Filed: Apr. 24, 2019

(86) PCT No.: PCT/JP2019/017353
§ 371 (c)(1),
(2) Date: Nov. 17, 2020

(87) PCT Pub. No.: WO2019/220891
PCT Pub. Date: Nov. 21, 2019

(65) Prior Publication Data
US 2021/0217785 A1 Jul. 15, 2021

(30) Foreign Application Priority Data
May 17, 2018 (JP) .............................. JP2018-095451

(51) Int. Cl.
*H01L 27/144* (2006.01)
(52) U.S. Cl.
CPC ................................ *H01L 27/1443* (2013.01)

(58) Field of Classification Search
CPC ............. H01L 27/1443; H01L 27/0255; H01L 27/0248; H01L 31/02327; H01L 31/028; H01L 31/105; H01L 29/165; H01L 29/866
See application file for complete search history.

(56) References Cited

U.S. PATENT DOCUMENTS

| | | | | | |
|---|---|---|---|---|---|
| 2,790,037 | A | * | 4/1957 | Shockley | H01L 29/00 257/256 |
| 2,840,770 | A | * | 6/1958 | Jackson | B28D 5/00 257/41 |
| 2,967,793 | A | * | 1/1961 | Philips | H03K 17/73 257/586 |
| 9,726,841 | B1 | * | 8/2017 | Lin | H01L 27/0248 |

(Continued)

FOREIGN PATENT DOCUMENTS

JP             5370857 A        9/2013

OTHER PUBLICATIONS

International Search Report dated Jun. 11, 2019, issued in PCT Application No. PCT/JP2019/017353, filed Apr. 24, 2019.

*Primary Examiner* — Sitaramarao S Yechuri
(74) *Attorney, Agent, or Firm* — Workman Nydegger

(57) ABSTRACT

To provide a photodetector that is capable of preventing breakdown caused by electrostatic discharge and with which the breakdown voltage can be expected to enhanced by at least 100 V. In the photodetector of the present invention, a Zener diode made of a germanium and a silicon is connected to a germanium photodiode (GePD). In the photodetector, a silicon substrate, a lower cladding layer, a silicon core layer, and an upper cladding layer provided in the photodiode and the Zener diode are shared by the photodiode and the Zener diode.

8 Claims, 8 Drawing Sheets

(56) References Cited

U.S. PATENT DOCUMENTS

| | | | |
|---|---|---|---|
| 2009/0283848 A1* | 11/2009 | Tan | H01L 27/0248 |
| | | | 257/438 |
| 2015/0084092 A1* | 3/2015 | Fonteneau | H01L 31/1113 |
| | | | 257/109 |
| 2016/0359056 A1* | 12/2016 | Chi | H01L 29/866 |
| 2017/0033092 A1* | 2/2017 | Weimar | H01L 25/167 |
| 2017/0317116 A1* | 11/2017 | Celo | H01L 27/14652 |
| 2018/0348428 A1* | 12/2018 | Shi | H04B 10/61 |
| 2019/0181281 A1* | 6/2019 | Ritenour | H01L 31/1892 |

\* cited by examiner

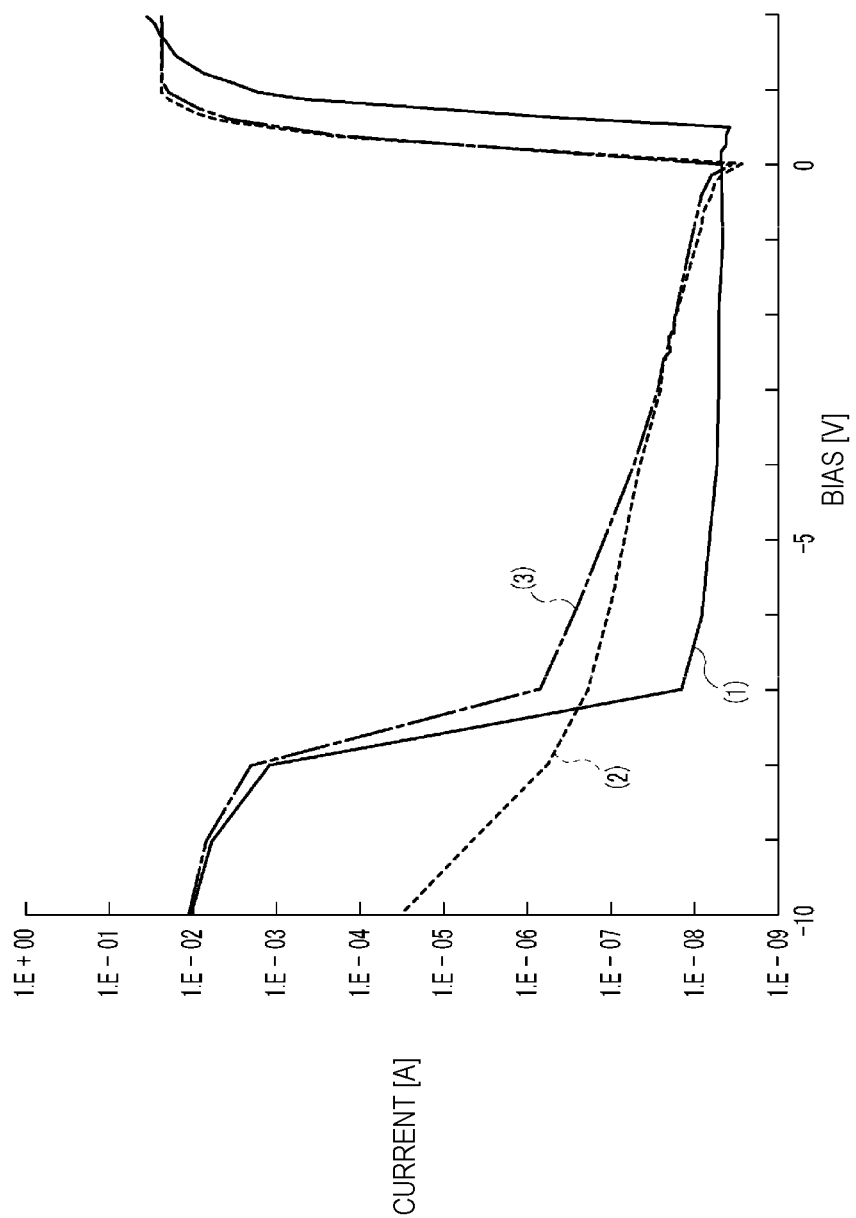

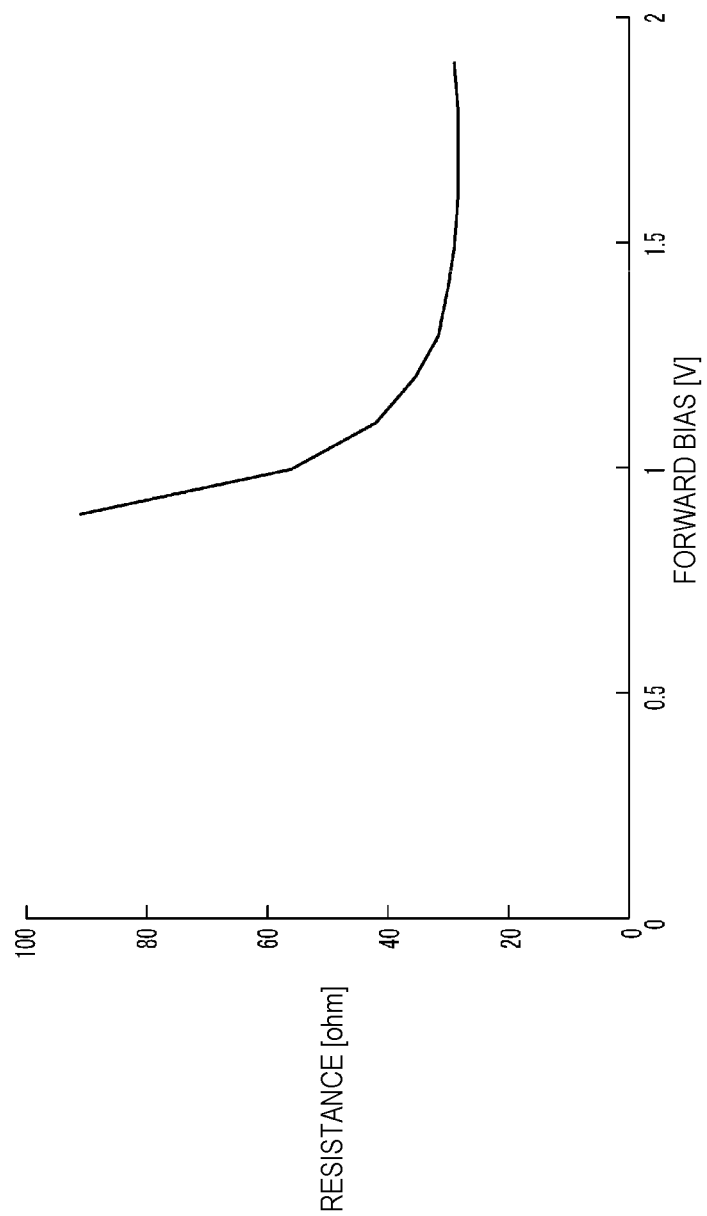

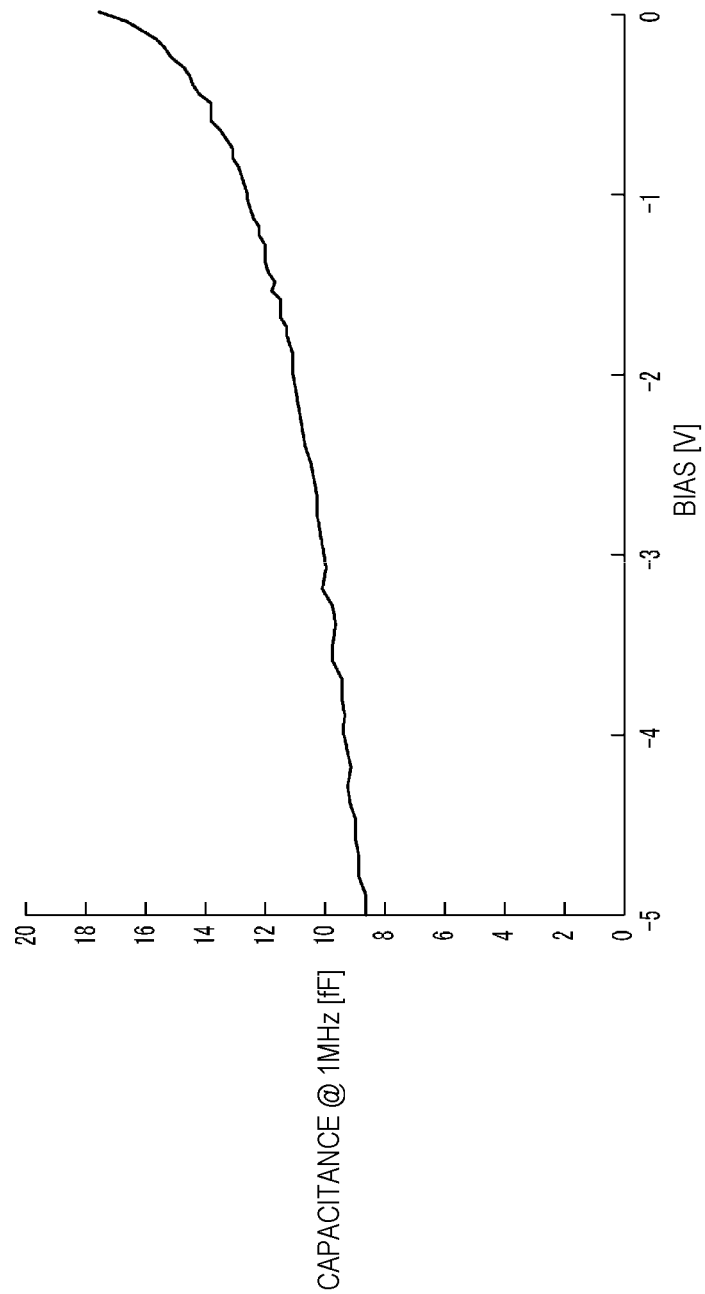

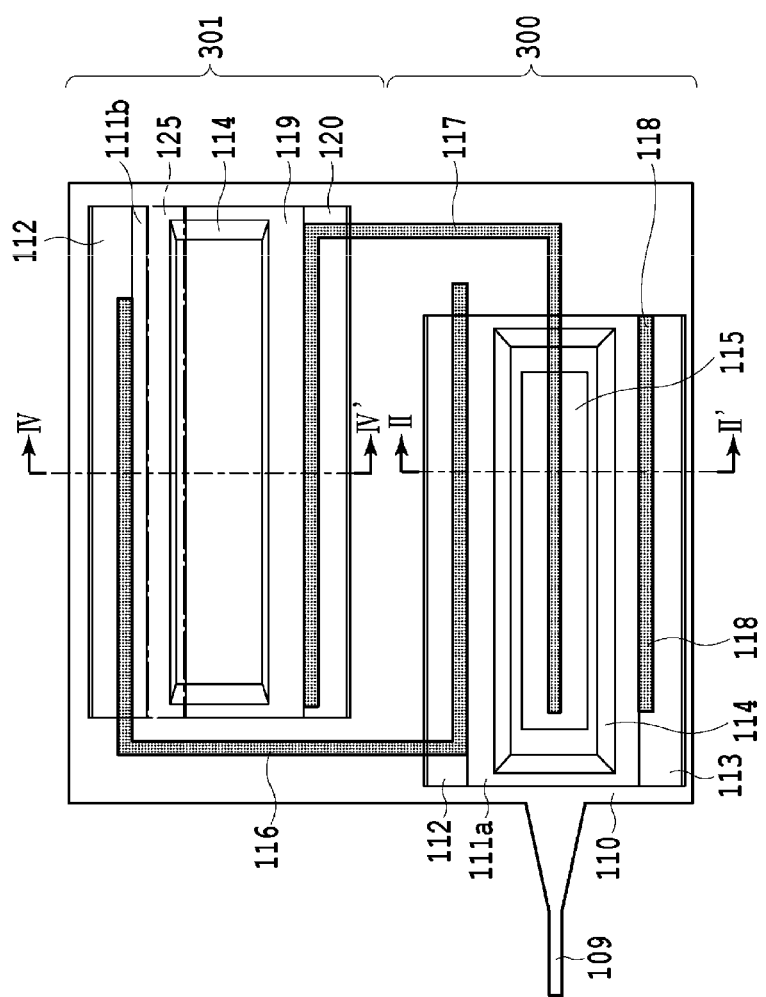

PHOTODETECTOR

TECHNICAL FIELD

The present invention relates to a photodetector used in an optical communication system and an optical information processing system, and more particularly to a structure for providing a photodetector excellent in resistance to electrostatic discharge.

BACKGROUND ART

With the recent spread of optical communication, cost reduction of optical communication devices is demanded. As one of the solutions, there is a method of forming an optical circuit constituting an optical communication device on a large-diameter wafer such as a silicon wafer by using a micro optical circuit technique such as silicon photonics. This allows the material cost per chip to be dramatically reduced, thereby achieving cost reduction of the optical communication devices.

As a typical photodetector formed on a silicon (Si) substrate using such a technique, there is a germanium photodetector (GePD) capable of monolithic integration. FIG. 1 is a view schematically showing a structure of a conventional waveguide-coupling vertical type GePD. FIG. 2 is a cross-sectional view taken along the line II-II' of FIG. 1. It should be noted that in FIG. 1, in order to make the structure easier to understand, an upper cladding layer 103 and electrodes 116 to 118 shown in FIG. 2 are omitted and only the positions of electrodes 116 to 118 that are in contact with a $p^{++}$ silicon electrode unit 112, a $p^{++}$ silicon electrode unit 113, and a n-type Ge region 115 are indicated by squares. These squares indicate the connection surfaces of the electrodes 116 to 118. The $p^{++}$ silicon electrode unit 112 is also referred to as a $p^{++}$ Si electrode unit or a p-type silicon electrode part.

The GePD is formed on an SOI (Silicon On Insulator) substrate made of a Si substrate, a Si oxide film, and a surface Si layer by using a lithography technique or the like. A GePD 100 shown in FIG. 2 is provide with a Si substrate 101, a lower cladding layer 102 made of a Si oxide film on the Si substrate, a core layer 110, a waveguide (silicon waveguide layer) 109 that guides a signal light, a germanium (Ge) layer 114 that absorbs light formed on the core layer 110, and an upper cladding layer 103 formed on the core layer 110 and the Ge layer 114.

Over the core layer 110, a p-type silicon (Si) slab 111a doped with p-type impurity ions, a $p^{++}$ silicon electrode unit 112 and a $p^{++}$ silicon electrode unit 113 doped with p-type impurities in high concentration and acting as electrodes are formed. The Ge layer 114 is stacked by epitaxial growth, and an n-type Ge region 115 doped with n-type impurities is formed on the upper part of the Ge layer 114. Then, the electrodes 116 to 118 are provided on the $p^{++}$ silicon electrode unit 112, the $p^{++}$ silicon electrode unit 113, and the n-type Ge region 115 so as to be in contact therewith.

In the GePD, when light is made to enter the core layer 110 and is absorbed by the Ge layer 114, a photocurrent passes between the electrode 117 and the electrodes 116, and between the electrode 117 and the electrode 118, and the light is detected by detecting the current.

CITATION LIST

Patent Literature

Patent Literature 1: Japanese Patent No. 5370857

SUMMARY OF THE INVENTION

Technical Problem

A general GePD shown in FIG. 1 and FIG. 2 have a problem that it is vulnerable to electrostatic discharge. Electrostatic discharge is a phenomenon in which a high-voltage pulse is instantaneously applied to a device, and general standard models for electrostatic discharge include a charging device model, a machine model, and a human body model. For example, a general GePD has a breakdown voltage of approximately 50 to 150 V in a human body model. The breakdown voltage in a human body model required for a general device is approximately 250 to 500 V, and the breakdown voltage of GePDs is insufficient. Common means to increase the breakdown voltage for electrostatic discharge include addition of a capacitor in parallel, addition of a resistor in series, and addition of a varistor or a Zener diode in parallel. However, addition of a resistor or a capacitor causes a problem of degrading high-speed characteristics of GePDs. Additionally, there are challenges that a general varistor or Zener diode cannot show the operation threshold that provides appropriate protection; a capacitance of a varistor or a Zener diode itself is a factor that degrades the high-speed characteristics of GePDs, and the circuit scale increases because a varistor or a Zener diode is a component attached externally due to its difficulty in monolithic integration on a silicon substrate.

The present invention has been made in view of such problems, and an object thereof is to provide a photodetector that is capable of preventing breakdown caused by electrostatic discharge and with which a breakdown voltage can be expected to enhance by at least 100 V.

Means for Solving the Problem

The present invention has been made to solve such problems, and is a photodetector provided with a Zener diode that can be monolithically integrated into a general GePD by a silicon photonics technology. The Zener diode provided in the present invention has an extremely low capacity and a low series resistance, and has an operation voltage of 0.5 to −7 V, which not only covers the general operation voltage of GePDs, which is from 0 to 3 V, but also protects GePDs because its threshold voltage is as low as −7 V. This prevents deterioration of the high-speed characteristics of GePDs, and with the monolithic integration, an increase in the circuit scale and the number of manufacturing processes is suppressed.

The photodetector of the present invention has the following structure. As shown in FIG. 3, a Zener diode 301 made of a germanium and a silicon is connected in parallel to a general GePD 300. The Zener diode connected in the present invention has a cross-sectional structure as shown in FIG. 4.

To achieve the above object, a first aspect of the present invention is a photodetector including a photodiode and a Zener diode, in which the photodiode is provided with an anode electrode and a cathode electrode, and the Zener diode is provided with a silicon substrate; a lower cladding layer on the silicon substrate; a silicon core layer on the lower cladding layer, including a first-type silicon region doped with first-type impurity ions and a second-type silicon region doped with second-type impurity ions; a silicon waveguide layer connected to the silicon core layer; a germanium layer on the silicon core layer; an upper cladding layer on the germanium layer; and an anode electrode and a cathode electrode each connected to either one of the first-type silicon region and the second-type silicon region, and the anode electrode of the Zener diode is connected to the anode electrode of the photodiode, and the cathode electrode of the Zener diode is connected to the cathode electrode of the photodiode.

Further, a second aspect of the present invention is the photodetector according to the first aspect, in which, in the Zener diode, the second-type silicon region is disposed directly below the germanium layer; an intrinsic silicon region is disposed between a bottom surface of the germanium layer and the first-type silicon region; and the intrinsic silicon region is disposed between the first-type silicon region and the second-type silicon region.

Further, a third aspect of the present invention is the photodetector according to the first aspect or the second aspect, in which the photodiode is provided with a silicon substrate; a lower cladding layer on the silicon substrate; a silicon core layer on the lower cladding layer, including a first-type silicon slab doped with first-type impurity ions; a silicon waveguide layer connected to the silicon core layer; a germanium layer on the silicon core layer, including a second-type germanium region doped with second-type impurities; an upper cladding layer on the silicon core layer and the germanium layer; and electrodes connected to the first-type silicon slab and the second-type germanium region, respectively.

Further, a fourth aspect of the present invention is the photodetector according to the third aspect, in which the silicon substrate, the lower cladding layer, the silicon core layer, and the upper cladding layer provided in the photodiode and the Zener diode are shared by the photodiode and the Zener diode.

Further, a fifth aspect of the present invention is the photodetector according to the fourth aspect, in which the photodiode and the Zener diode are aligned in an incident direction of light passing through the silicon waveguide layer provided in the photodiode.

Further, a sixth aspect of the present invention is the photodetector according to the fourth aspect, in which the photodiode and the Zener diode are aligned in a direction perpendicular to an incident direction of light passing through the silicon waveguide layer provided in the photodiode.

Further, a seventh aspect of the present invention is the photodetector according to any one of the first to sixth aspects, in which a plurality of the Zener diodes is connected to the photodiode.

Further, an eighth aspect of the present invention is the photodetector according to any one of the first to seventh aspects, in which the first-type impurity ions are p-type impurity ions, and the second-type impurity ions are n-type impurity ions.

Effects of the Invention

The photodetector of the present invention is capable of preventing breakdown caused by electrostatic discharge because the voltage applied to the GePD is constant for protection until the Zener diode is broken. Further, with the photodetector of the present invention, the breakdown voltage can be expected to enhance by at least 100 V as compared with the general GePD, thereby making it possible to reach the breakdown voltage generally required for the human body model.

BRIEF DESCRIPTION OF DRAWINGS

FIG. 5 is a diagram showing current-voltage curves of the photodetector of the present invention, the general vertical GePD, and the Zener diode provided in the photodetector of the present invention.

FIG. 6 is a diagram showing a voltage-resistance curve of the Zener diode provided in the photodetector of the present invention.

FIG. 7 is a diagram showing a voltage-capacitance curve of the Zener diode provided in the photodetector of the present invention.

FIG. 8 is a view showing the photodetector related to Example 2 of the present invention.

DESCRIPTION OF EMBODIMENT

Figure 1:
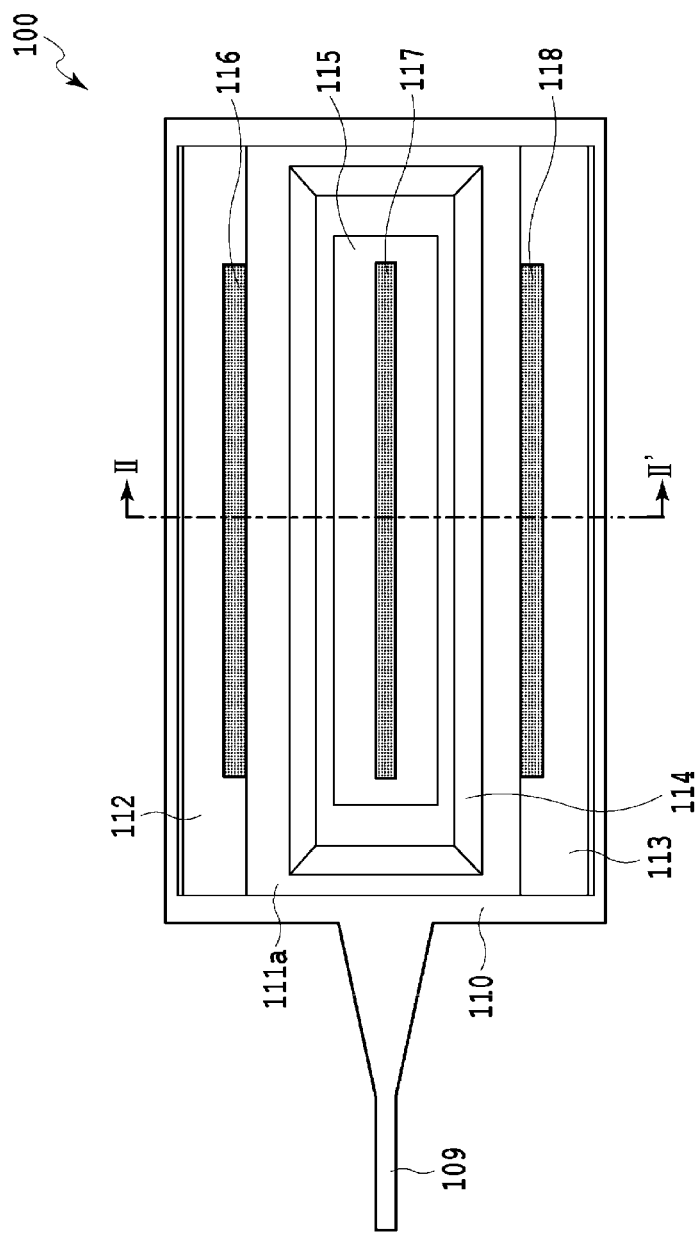
FIG. 1 is a view showing a conventional vertical type GePD.

Hereinafter, an embodiment of an optical modulator of the present invention will be described in detail with reference to examples and drawings. It should be noted that in the drawings, portions having the same function are given the same numbers to clarify the explanation. However, the present invention is not limited to the description of the embodiment described below, and it is obvious to those skilled in the art that various changes in form and details can be made without departing from the spirit of the invention disclosed in this specification and the like.

EXAMPLE 1

Figure 2:
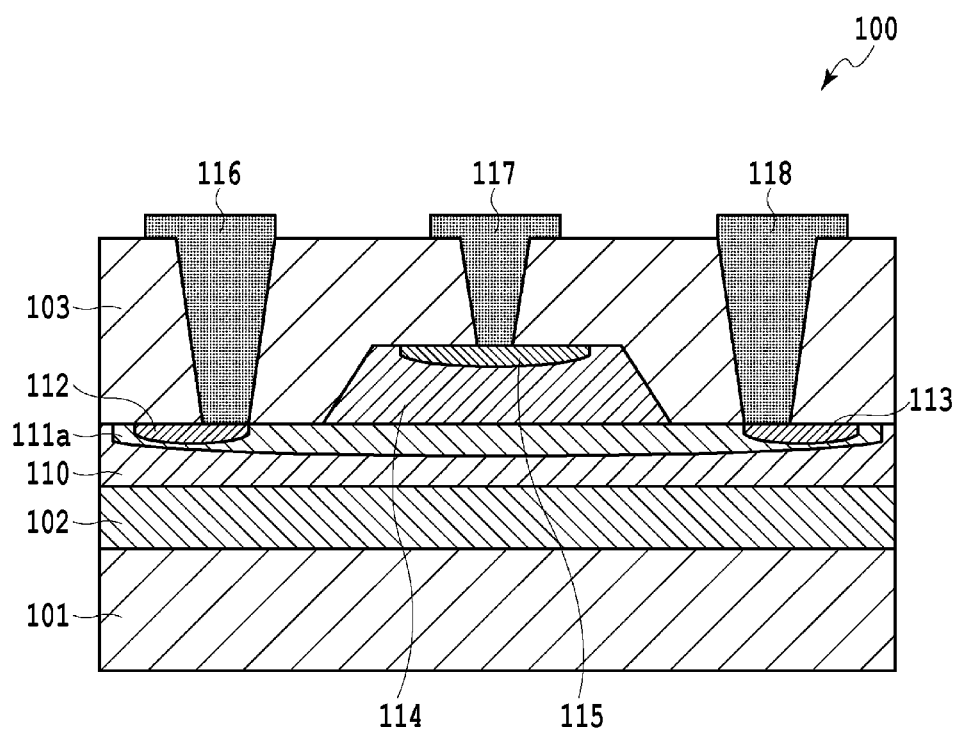
FIG. 2 is a view showing a cross-sectional structure of the GePD of FIG. 1.
Figure 3:
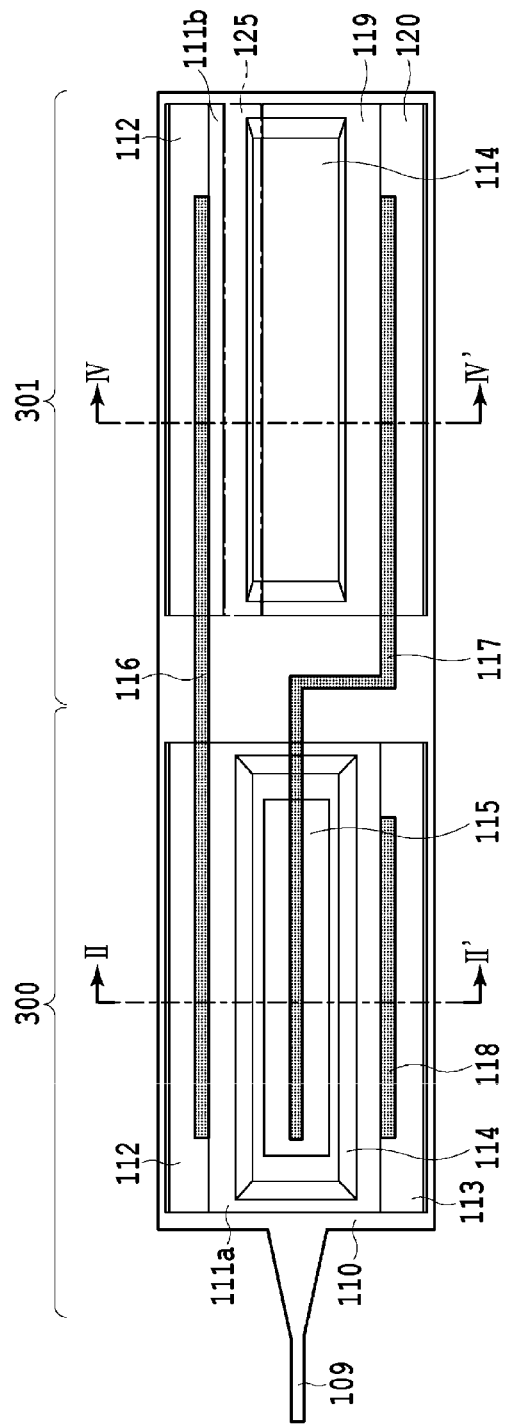
FIG. 3 is a view showing a structure of the photodetector of the present invention.

FIG. 3 shows a structure of a photodetector of the present invention. The GePD has the same structure as a general GePD 100 of FIG. 1. In this example, a GePD 300 and a Zener diode 301 are configured to be aligned in a straight line when viewed from a waveguide 109, and configured to be oriented in an incident direction of light from the waveguide 109. A cross-sectional view taken along the broken line II-II' and a cross-sectional view taken along the broken line IV-IV' in FIG. 3 correspond to FIG. 2 and FIG. 4, respectively.

In the Zener diode 301 of FIG. 3, a p-type silicon slab 111a doped with p-type impurity ions, a $P^{++}$ silicon electrode unit 112 doped with p-type impurities in high concentration and acting as an electrode, a n-type silicon slab 119 doped with n-type impurity ions, and an $n^{++}$ silicon electrode unit 120 doped with n-type impurities in high concentration and acting as an electrode are formed on a core layer 110 made of a silicon (also referred to as a silicon core layer). The n-type silicon slab is also referred to as an n-type Si slab or an n-type silicon region. The $n^{++}$ silicon electrode unit is also referred to as an n unit silicon electrode unit or an n-type electrode unit. A Ge layer 114 is stacked by epitaxial growth. Then, an electrode 116 and an electrode 117 are provided on the $p^{++}$ silicon electrode unit 112 and the $n^{++}$ silicon electrode unit 120 so as to be in contact therewith. The electrode 116 and the electrode 117 are connected to electrodes of the GePD 300.

The Ge layer 114 is formed on the n-type silicon slab 119 and is not formed on a p-type silicon (Si) region 111b. There is a gap between the p-type silicon region 111b and the n-type silicon slab 119, where an intrinsic silicon region 125 is provided. The size of the gap determines a threshold value on the reverse bias side of the Zener diode.

An anode electrode of the Zener diode 301 and an anode electrode of the GePD 300 are connected, and a cathode electrode of the Zener diode 301 and a cathode electrode of the GePD 300 are connected.

When the electrode 116 functions as an anode electrode, the electrode 117 and an electrode 118 function as cathode electrodes. Further, when the electrode 116 functions as a cathode electrode, the electrodes 117 and 118 function as anode electrodes.

Figure 4:
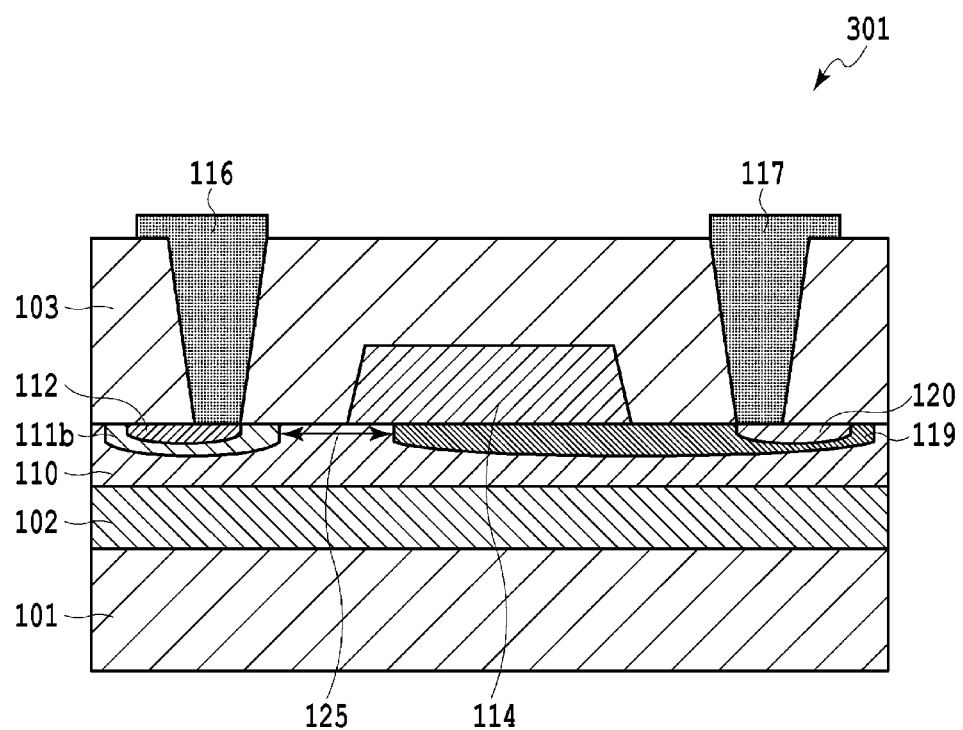
FIG. 4 is a view showing a cross-sectional structure of a Zener diode provided in the photodetector of the present invention.

FIG. 4 is a cross-sectional view taken along the line IV-IV' of the Zener diode 301 of the present invention. There is no p-type silicon region 111*b*, which is laid on the core layer 110, directly under the Ge layer 114, and the n-type silicon slab 119 is disposed under the Ge layer 114. The p++ silicon electrode unit 112 is disposed on the p-type silicon region 111*b*, the n++ silicon electrode unit 120 is disposed on the n-type silicon slab 119, and the p++ silicon electrode unit 112 is connected to the electrode 116. Further, the n++ silicon electrode unit 120 is connected to the electrode 117. Between the p-type silicon region 111*b* and the n-type silicon slab 119, the intrinsic silicon region 125 is disposed without ion implantation. The operation threshold of the Zener diode is determined by the size of the intrinsic silicon region 125 and the doping concentrations of the p-type silicon region 111*b* and the n-type silicon slab 119. In order to adjust the operation threshold, the intrinsic silicon region 125 may be eliminated, and the p-type silicon region 111*b* and the n-type silicon slab 119 may be brought into contact with each other. At this time, the p-type silicon region 111*b* may enter directly under the Ge layer 114.

In the present example, the current-voltage relations among the photodetector of the present invention, the general vertical type GePD, and the Zener diode provided in the photodetector of the present invention will be described with reference to FIG. 5.

The Zener diode provided in the photodetector of the present invention shows current-voltage characteristics as shown by (1) of FIG. 5. Current-voltage characteristics of the general GePD is shown by (2) of FIG. 5. Further, (3) of FIG. 5 shows current-voltage characteristics of the photodetector having the structure of FIG. 3 in which the GePD having the structure of Example 1 is provided with a Zener diode.

As shown by (1) of FIG. 5, the Zener diode of the present invention increases a current at a time from approximately −7V at the reverse bias side, and increases a current at a time from approximately 0.5 V at the forward bias side. Further, a current passing between 0.5 V and −7 V is approximately several n A, which is a typical Zener diode behavior. Seen from the current-voltage characteristics of the photodetector having a structure of the present invention as shown by (3) of FIG. 5, unlike the current-voltage characteristics of the conventional GePD as shown by (2) of FIG. 5, a behavior is exhibited as if the current-voltage characteristics of the Zener diode of (1) of FIG. 5 has been overlapped, where the current is increased at a time from approximately −7 V. When there is an instantaneous voltage increase due to electrostatic discharge, the sudden current increase of the Zener diode serves a function to maintain a voltage applied to the GePD at approximately −7 V. Thus, breakdown caused by electrostatic discharge can be prevented because the voltage applied to the GePD is constant for protection until the Zener diode is broken. With the photodetector of the present invention, the breakdown voltage can be expected to enhance by at least 100 V as compared with the general GePD, thereby making it possible to reach the breakdown voltage generally required for the human body model.

FIG. 6 shows a change in resistance when a forward bias is applied to the Zener diode of the present invention. It is saturated at approximately 30Ω, indicating that a series resistance component of the Zener diode is approximately 30Ω.

FIG. 7 shows a change in capacitance of the Zener diode of the present invention with respect to a reverse bias. The capacitance is shifting between approximately 8-15 fF.

CR time constants calculated from the capacitance and the resistance of FIGS. 6 and 7 greatly exceeds 100 GHz, and it is understood that the addition of the Zener diode does not degrade the high-speed operation characteristics of the GePD. The GePD 300 is not limited to the vertical type GePD shown in FIG. 1 and FIG. 2, but may be changed to another photodiode manufactured by silicon photonics.

FIG. 4 is a cross-sectional view taken along the line IV-IV' of the Zener diode 301 of the present invention. There is no p-type silicon region 111*b*, which is laid on the core layer 110, directly under the Ge layer 114, and the n-type silicon slab 119 is disposed under the Ge layer 114. The p++ silicon electrode unit 112 is disposed on the p-type silicon region 111*b*, the n++silicon electrode unit 120 is disposed on the n-type silicon slab 119, and the p++ silicon electrode unit 112 is connected to the electrode 116. Further, the n++ silicon electrode unit 120 is connected to the electrode 117. Between the p-type silicon region 111*b* and the n-type silicon slab 119, the intrinsic silicon region 125 is disposed without ion implantation. The operation threshold of the Zener diode is determined by the size of the intrinsic silicon region 125 and the doping concentrations of the p-type silicon region 111*b* and the n-type silicon slab 119. In order to adjust the operation threshold, the intrinsic silicon region 125 may be eliminated, and the p-type silicon region 111*b* and the n-type silicon slab 119 may be brought into contact with each other. At this time, the p-type silicon region 111*b* may enter directly under the Ge layer 114.

EXAMPLE 2

FIG. 8 is an example in which the Zener diode 301 of the present invention is arranged next to the GePD 300. While the GePD 300 and the Zener diode 301 are configured so as to be aligned in a straight line when viewed from the waveguide 109 in Example 1 of FIG. 3, the GePD 300 and the Zener diode 301 are configured so as not to be aligned in a straight line when viewed from the waveguide 109, but so as to be arranged in a direction perpendicular to an incident direction of light from the waveguide 109 in Example 2 of FIG. 8. The longitudinal direction of the Ge layer 114 of the GePD 300 and the longitudinal direction of the Ge layer 114 of the Zener diode 301 are in a substantially parallel relation. A cross-sectional view taken along the broken line II-II' and a cross-sectional view taken along the broken line IV-IV' in FIG. 8 correspond to FIG. 2 and FIG. 4, respectively.

In the structure of FIG. 8, since the light traveling straight from the waveguide 109 does not enter the Zener diode 301, the photocurrent is not detected by the Zener diode.

Further, in FIG. 8, one Zener diode 301 is connected to the GePD 300, but a plurality of Zener diodes 301 may be connected. In that case, although the high-speed operation characteristics of the GePD is affected, higher resistance to electrostatic discharge can be obtained.

INDUSTRIAL APPLICABILITY

The present invention relates to a photodetector used in an optical communication system and an optical information processing system, and can be applied particularly to a photodetector excellent in resistance to electrostatic discharge.

REFERENCE SIGNS LIST 100, 300 GePD
101 Si substrate
102 Lower cladding layer
103 Upper cladding layer
109 Waveguide
110 Core layer
111a P-type silicon slab
111b P-type silicon region
112 P$^{++}$ silicon electrode unit
113 P$^{++}$ silicon electrode unit
114 Ge layer
115 N-type Ge region
116, 117, 118 Electrode
119 N-type silicon slab
120 N$^{++}$ silicon electrode unit
125 Intrinsic silicon region
301 Zener diode

The invention claimed is:

1. A photodetector comprising a photodiode and a Zener diode, wherein:
the photodiode is provided with an anode electrode and a cathode electrode, and
the Zener diode is provided with
a silicon substrate;
a lower cladding layer on the silicon substrate;
a core layer on the lower cladding layer, provided a first-type silicon region doped with first-type impurity ions and a second-type silicon region doped with second-type impurity ions on;
a germanium layer over the core layer;
an upper cladding layer on the germanium layer; and
an anode electrode and a cathode electrode each connected to either one of the first-type silicon region and the second-type silicon region, and
the anode electrode of the Zener diode is connected to the anode electrode of the photodiode, and
the cathode electrode of the Zener diode is connected to the cathode electrode of the photodiode.

2. The photodetector according to claim 1, wherein:
in the Zener diode,
the second-type silicon region is disposed directly below the germanium layer;
an intrinsic silicon region is disposed between a bottom surface of the germanium layer and the first-type silicon region; and
the intrinsic silicon region is disposed between the first-type silicon region and the second-type silicon region.

3. The photodetector according to claim 1, wherein:
the photodiode is provided with
a silicon substrate;
a lower cladding layer on the silicon substrate;
a core layer on the lower cladding layer, provided a first-type silicon slab doped with first-type impurity ions on;
a waveguide layer connected to the core layer;
a germanium layer on the core layer, including a second-type germanium region doped with second-type impurities;
an upper cladding layer on the core layer and the germanium layer; and
electrodes connected to the first-type silicon slab and the second-type germanium region, respectively.

4. The photodetector according to claim 3, wherein the silicon substrate, the lower cladding layer, the core layer, and the upper cladding layer provided in the photodiode and the Zener diode are shared by the photodiode and the Zener diode.

5. The photodetector according to claim 4, wherein the photodiode and the Zener diode are aligned in an incident direction of light passing through the waveguide layer provided in the photodiode.

6. The photodetector according to claim 4, wherein the photodiode and the Zener diode are aligned in a direction perpendicular to an incident direction of light passing through the waveguide layer provided in the photodiode.

7. The photodetector according to claim 1, wherein a plurality of the Zener diodes is connected to the photodiode.

8. The photodetector according to claim 1, wherein the first-type impurity ions are p-type impurity ions, and the second-type impurity ions are n-type impurity ions.

* * * * *